United States Patent [19]  [11]  4,315,316
Boros et al.  [45]  Feb. 9, 1982

[54] DIGITAL ARRANGEMENT FOR DETERMINING AVERAGE CURRENT OF A CIRCUIT BY MONITORING A VOLTAGE

[75] Inventors: Victor B. Boros, New York, N.Y.; Frederick E. Thau, Teaneck, N.J.

[73] Assignee: Bell Telephone Laboratories, Incorporated, Murray Hill, N.J.

[21] Appl. No.: 98,475

[22] Filed: Nov. 29, 1979

[51] Int. Cl.³ ............................................... G05F 1/56
[52] U.S. Cl. ................................... 364/483; 323/283; 323/286
[58] Field of Search ............... 364/483, 575, 732, 734; 323/17, DIG. 1, 283, 286; 324/111, 140 R

[56]  References Cited

U.S. PATENT DOCUMENTS

| | | | |
|---|---|---|---|
| 4,074,175 | 2/1978 | Born et al. | 323/DIG. 1 |
| 4,095,165 | 6/1978 | Boros | 323/DIG. 1 |
| 4,109,194 | 8/1978 | Miller | 323/DIG. 1 |

Primary Examiner—Charles E. Atkinson
Assistant Examiner—Gary Chin
Attorney, Agent, or Firm—Alfred G. Steinmetz

[57]  ABSTRACT

A current monitoring scheme operates in an indirect fashion to estimate the current output of a circuit from a measured voltage output. Voltage data is processed in accord with state variable theory to derive a current estimate without direct sensing of the current.

7 Claims, 5 Drawing Figures

DIGITAL ARRANGEMENT FOR DETERMINING AVERAGE CURRENT OF A CIRCUIT BY MONITORING A VOLTAGE

FIELD OF THE INVENTION

This invention is concerned with signal sensing in regulated power supplies. It is specifically concerned with indirect signal sensing by estimating one signal through sensing of a related signal.

BACKGROUND OF THE INVENTION

It is desirable to monitor the output current as well as the output voltage of a power supply for varied purposes, such as current regulation, overcurrent limit protection or similar desirable objectives. This generally requires dual sensing devices; one sensing the output voltage and another sensing the output current. Voltage sensing devices draw very little power and have a limited effect on the voltage signal which they are sensing.

Current sensing devices, on the other hand, are usually connected in series with the path of the current to be sensed and hence must conduct the full current flow. In order to limit the power dissipation of the current sensing device, its resistance is usually extremely low. Hence, a voltage sensed across the current sensing device is a very low level signal. Measurements of these very low level signals have inherent noise and stability problems because of the necessary sensitive detecting devices.

SUMMARY OF THE INVENTION

Indirect monitoring means are, therefore, preferable. In accord with this objective, a monitoring system is disclosed herein, in accordance with the principles of the invention, which estimates the current output of a switching regulator by monitoring its output voltage. Digital sensing circuitry is operative to derive a numerical value functionally related to the average output voltage of the switching regulator. A second numerical value responsive to a differential of the average output voltage is derived. These numerical values are processed by arithmetical digital circuitry synthesized in terms of parameters of the switching regulator circuit to generate a digital signal proportional to the average current output.

BRIEF DESCRIPTION OF THE DRAWINGS

The invention may be understood by reference to the following description in connection with the accompanying drawings in which.

DETAILED DESCRIPTION

Figure 1:
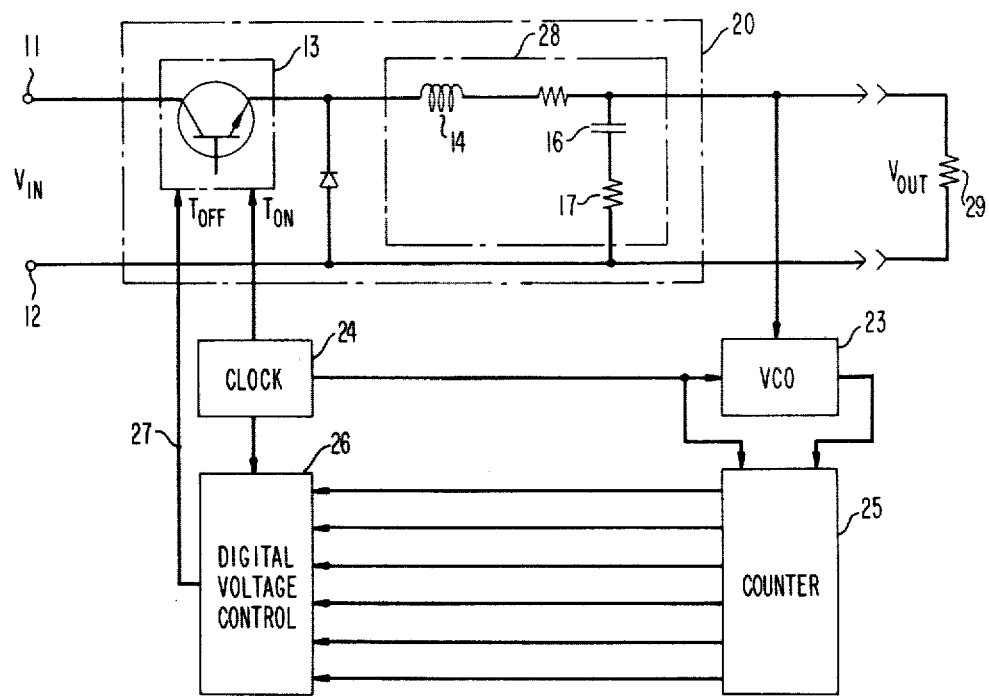
FIG. 1 is a combination block diagram and schematic of a switching regulator having a digital feedback control to regulate the output voltage.

The power supply disclosed in FIG. 1 is a pulse-width modulated switching regulator 20 which incorporates a voltage-to-frequency converter in a digital feedback control to regulate the output voltage. A DC voltage source is applied to input terminals 11 and 12 and is coupled to a load impedance 29 through a switching device 13 and a low-pass filter 28. Switching device 13 is controlled by a feedback circuit including a voltage controlled oscillator 23, a counter 25 and a digital voltage control 26. Regulator 20 includes the input-output circuits and a signal control arrangement which is common to all DC-to-DC converters.

A clock or periodic timing source 24 is utilized to establish the modulation period (T). Clock 24 periodically generates a timing pulse which is utilized to bias switch 13 conducting and to preset voltage controlled oscillator 23, counter 25 and digital voltage control 26.

Voltage controlled oscillator 23 is coupled to operate proportionally to the output voltage as appearing across the filter capacitor 16. The output signal frequency of the voltage controlled oscillator 23 is a direct function of the magnitude of the output voltage appearing across filter capacitor 16. This signal frequency is applied to counter 25 which continuously accumulates a count responsive to the number of cycles of the signal output of the voltage controlled oscillator. Digital voltage control 26 includes circuitry to continuously compare this accumulating count of counter 25 with a predetermined reference count. When the accumulating count equals the reference count, the digital voltage control 26 generates a signal which is applied on lead 27 to bias switch 13 nonconducting. It is apparent that the rate at which the count accumulates in counter 25 is proportional to the average output voltage and determines the duration of the conducting interval of the switch 13.

There are many reasons to determine the output current of the switching regulator 20 shown in FIG. 1. It may be desirable to limit the output current to protect a sensitive output load or to protect switching device 13 itself.

Those skilled in the power supply art recognize that the switching regulator disclosed in FIG. 1 has a circuit topology common to the generalized DC-to-DC converter which may be represented by equations of an average model in state-space form. One of these equations for a basic averaged signal model is of the form:

$$X = Ax + bv - a \quad (1)$$

From this general form the following dynamic state-space equation can be derived:

$$\frac{d\hat{V}_o}{dt} = (\hat{I}_o)\frac{R}{(R+R_c)C} - (\hat{V}_o)\frac{1}{(R+R_c)C} \quad (2)$$

wherein:

$\hat{V}_o$ = average output voltage across capacitor 16;
$\hat{I}_o$ = average output current through inductor 14;
R = resistance of load 29; and
$R_c$ = resistance of filter capacitor 16 indicated by resistor 17.

Classical measurement techniques, to estimate signals from a differential of a related signal, have not been practical because the theory thereof deals with instantaneous signals. Noise associated with the instantaneous signals is amplified by the differentiation process, thereby introducing large errors into the differential term which, in turn, leads to large errors in the value of the estimated signal derived therefrom.

Equation (2) is expressed in terms of average values whereby instantaneous transient effects are absorbed by the integration processes which define the average values. It is, therefore, apparent that a derived estimated signal based on an average value of a signal will not be greatly in error due to instantaneous transients in the sensed signal.

Examination of the feedback control of the switching regulator in FIG. 1 indicates that the accumulating count in the counter 25 represents a value equivalent to the average value of the output voltage of the switching regulator in each cycle. This average value may be advantageously utilized to estimate a value of the output current of the regulator without the inherent noise difficulties indicated hereinabove.

The digital control circuitry in FIG. 1 determines the average output voltage of the switching regulator by periodically counting the signal cycles of the signal output of the voltage controlled oscillator 23 for the conducting interval of switch 13. Since the average output voltage is available, differential-type estimating techniques are utilized to determine a value proportional to a derivative of the output voltage. Digital arithmetical circuitry is used to synthesize these values in terms of parameters of the switching regulator circuit 20 to generate a digital signal proportional to the average output current. A digital current estimation circuit shown in FIG. 2 discloses one embodiment formulated to achieve current estimation in the terms of the above-described state equation (2).

The periodic output count of counter 25 representing the average voltage output of the regulator is determined by the analog-to-digital transfer characteristic of the voltage controlled oscillator 23. Since the voltage controlled oscillator 23 is operated in its linear range, this transfer may be expressed by the linear function:

$$N = MtVo \quad (3)$$

where:
N = number accumulated by counter 25;
M = voltage-to-frequency transfer slope of VCO 23 in hertz per volt;
T = sampling period of operation of switch 13; and
Vo = average output voltage of regulator 20.

Figure 2:
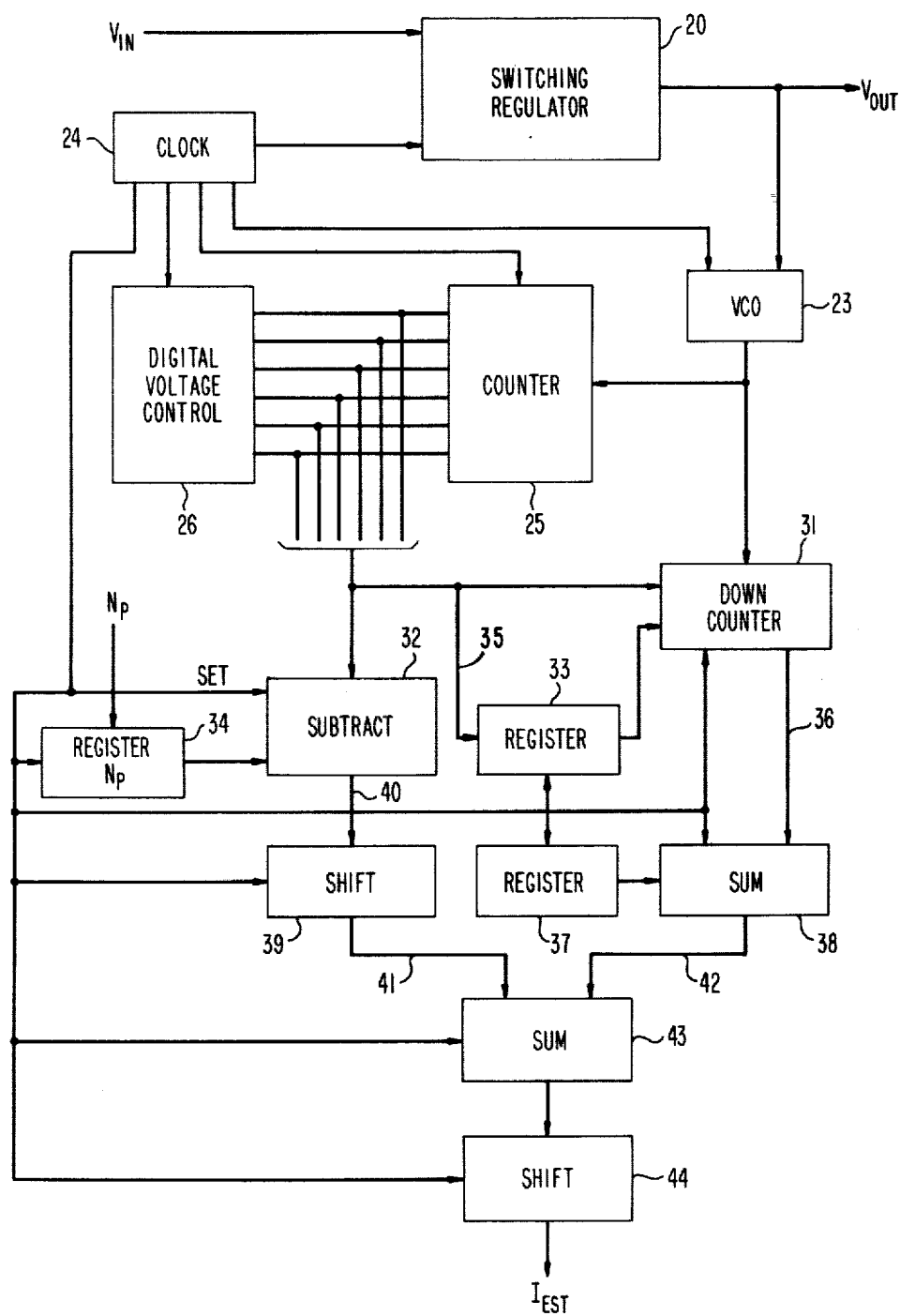
FIG. 2 is a block diagram of a current estimation circuit embodied in digital circuitry which is utilized with the switching regulator in FIG. 1.

An estimated value of average output current is derived from the detected average output voltage through means of a specific implementation of a digital arithmetical circuit arrangement disclosed in FIG. 2. This arrangement includes a voltage controlled oscillator 23 responsive to the output voltage of the regulator 20. Regulator 20 is identical to the regulator 20 in FIG. 1 discussed hereinabove.

The output of voltage controlled oscillator 23 is applied to a counter 25 included in the regulator feedback loop. The accumulated count in counter 25 is applied to a down counter 31 and a subtract circuit 32. As shown in FIG. 2, down counter 31 and subtract circuit 32, in common with the balance of components of the digital arithmetical circuitry, are operated synchronously in response to timing signals provided by clock 24. Details of synchronous operations of this circuit are not provided inasmuch as those skilled in the art can readily implement the appropriate timing signal scheme.

Subtract circuit 32 and down counter 31 are each responsive to the periodic count output of counter 25. They are utilized to obtain a numerical value proportional to a derivative of the average output voltage and a numerical value proportional to a deviation of the average output voltage from its desired regulated value, respectively. Register 33 stores a count value equal to a count attained by counter 25 during the preceeding sampling period, which is supplied thereto via lead 35. This count is applied to and decremented in down counter 31 by the output of voltage controlled oscillator 23 for the present sampling interval, thereby generating a count output $\Delta N$ on lead 36 which is a close approximation of the derivative of the average output voltage of the regulator:

$$\Delta N = MT^2 \frac{dVo}{dt} \quad (4)$$

Register 34 is preset with a reference count $N_p$ related to a nominal average output voltage. The attained count N of counter 25 is subtracted from this preset count $N_p$ by the subtract circuit 32 generating a count $N_e$ on lead 40 proportional to a difference between the average output voltage and the desired output voltage:

$$N_e = N - N_p = MT(Vo - V_{ref}) \quad (5)$$

where:
$N_e$ = count proportional to error between average output voltage Vo and desired reference voltage, $V_{ref}$;
N = count output of counter 25; and
$N_p$ = preset count of register 34 proportional to desired regulator voltage output.

From equation (2):

$$\hat{I}_o = \left\{ \frac{d\hat{V}o}{dt} + \hat{V}o \frac{1}{(R_c + R)C} \right\} \frac{C(R_c + R)}{R} \quad (6)$$

or $$\hat{I}_o = \left\{ \frac{\Delta N}{MT^2} + \hat{V}o \frac{1}{(R_c + R)C} \right\} \frac{C(R_c + R)}{R} \quad (7)$$

From equation (5)

$$\hat{V}o = \frac{N_e}{MT} + \hat{V}_{ref} \quad (8)$$

substituting $$I_o = \left\{ \frac{\Delta N}{MT^2} + \left[ \frac{N_e}{MT} + V_{ref} \right] \frac{1}{(R_c + R)C} \right\} \frac{C(R_c + R)}{R} \quad (9)$$

Equation (9) relates the average output current Io to known circuit parameters of the converter or switching regulator and to the approximate differential and error counts generated as hereinabove indicated. These values are approximated by appropriate digital arithmetical operations performed by the balance of the digital estimating circuitry. Register 37 is preset with a numerical value proportional to:

$$\frac{\hat{V}_{ref}}{(R_c + R)C} \quad (10)$$

and summed in adder 38 with the output of down counter 31 which approximates ΔN to derive a value:

$$N_1 = \frac{\hat{V}_{ref}}{(R_c + R)C} + \frac{\Delta N}{MT^2} \qquad (11)$$

Shift register 39 shifts the count output of subtractor 32 to approximate the value $$\frac{N_e}{MT(R_c + R)C}$$

While only one shift register 39 is shown, those skilled in the art recognize that multiple shifting operations may be necessary to approximate this value accurately. Count $N_2$ on lead 41 is given by:

$$N_2 = N_e \frac{1}{MT(R_c + R)C} \qquad (12)$$

so that equation (9) becomes:

$$I_o = \{N_1 + N_2\} \frac{C(R + R_c)}{R} \qquad (13)$$

Counts $N_1$ and $N_2$ on leads 41 and 42 are applied to adder 43 to obtain count $N_3$ where:

$$N_3 = N_1 + N_2. \qquad (14)$$

The output of adder 43 is applied to shift register 44 which shifts the count $N_3$ to approximately multiply it by the value $$\frac{C(R_c + R)}{R}$$

and derive a numerical value $I_n$ estimating the output current of the switching regulator 20.

The principles of the invention may be illustrated by showing how the current estimation circuitry is realized for a particular switching regulator having the following selected parameters:
  reference, Vo=4.5 volts;
  load resistance, R=2.25 ohms;
  capacitive resistance, $R_c$=0.01 ohms;
  capacitance, C=100 microfarads;
  transfer slope of voltage controlled oscillator, M=3×10⁶ hertz per volt
  sampling period, T=50 microseconds.
Using these values equation (9) reduces to:

$$I_o = \left\{ \Delta N + 33.15 \left[ 4.5 + \frac{N_e}{150} \right] \right\} \frac{1}{74.7} = \qquad (15)$$

$$\frac{\Delta N + 149.2 + 0.221 N_e}{74.7}.$$

A count value approximating the count proportional to the desired output voltage is stored in register 34 and subtracted by subtract circuit 32 from the accumulated count to derive an error count $N_e$. The output $N_e$ of subtract circuit 32 is shifted by shift register 39 to obtain $(\tfrac{1}{2})^2 N_e$ which approximates the value $0.221 N_e$ or $N_2$. The decremented count output ΔN of down counter 31 is combined in the adder 38 with the fixed count 149 contained in register 37. $N_1$ and $N_2$ on leads 41 and 42 are summed by adder 43 and shifted by shift register 44 to obtain $(\tfrac{1}{2})^6 N_3$ which approximates $1/74.7 \, N_3$ and is proportional to the average output current of the regulator.

While a specific example is shown, the invention is not limited to any specific example. Application of the principles disclosed herein to other DC-to-DC converter configurations will readily suggest themselves to those skilled in the art.

Figure 3:
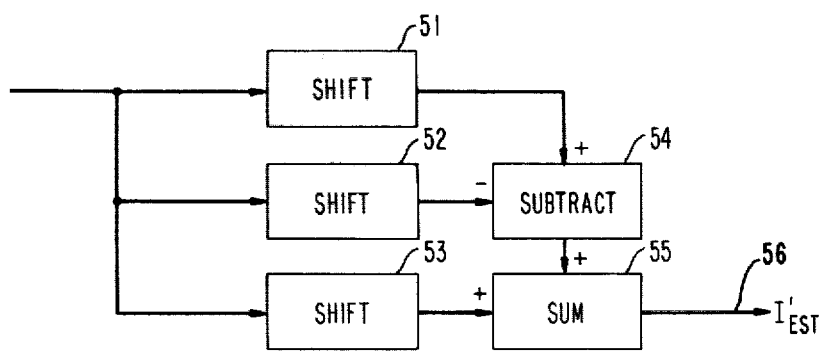
FIG. 3 is a block diagram of digital circuitry supplementary to the current estimator of FIG. 2 to improve the accuracy of the estimated current value derived therein.

An arithmetical digital circuit disclosed in FIG. 3 may be utilized in place of shift register 44 in FIG. 2 to derive an estimated current value of output current with higher accuracy. The count output of adder 43 of FIG. 2 is applied in parallel to shift registers 51, 52 and 53 of FIG. 3. In the above numerical example; $1/74.7 = 0.0134$ is approximated by $(\tfrac{1}{2})^6 = 0.0156$. The factors are different by the value 0.0022. Shift registers 51, 52 and 53 are adjusted to generate the values $(\tfrac{1}{2})^6 N_3$, $(\tfrac{1}{2})^8 N_3$ and $(\tfrac{1}{2})^9 N_3$, respectively. The output of shift register 52 is subtracted from the output of shift register 51 by subtract circuit 54. This value is summed by adder 55 with the output of shift register 53. It is apparent that the resultant output of adder 55 is $\{(\tfrac{1}{2})^6 - (\tfrac{1}{2})^8 + (\tfrac{1}{2})^9\} N_3$ or $0.0137 \, N_3$, closely approximating the value $1/74.7 = 0.0134$. The count approximating the estimated current appears at the output 56 of adder 55.

Figure 4:
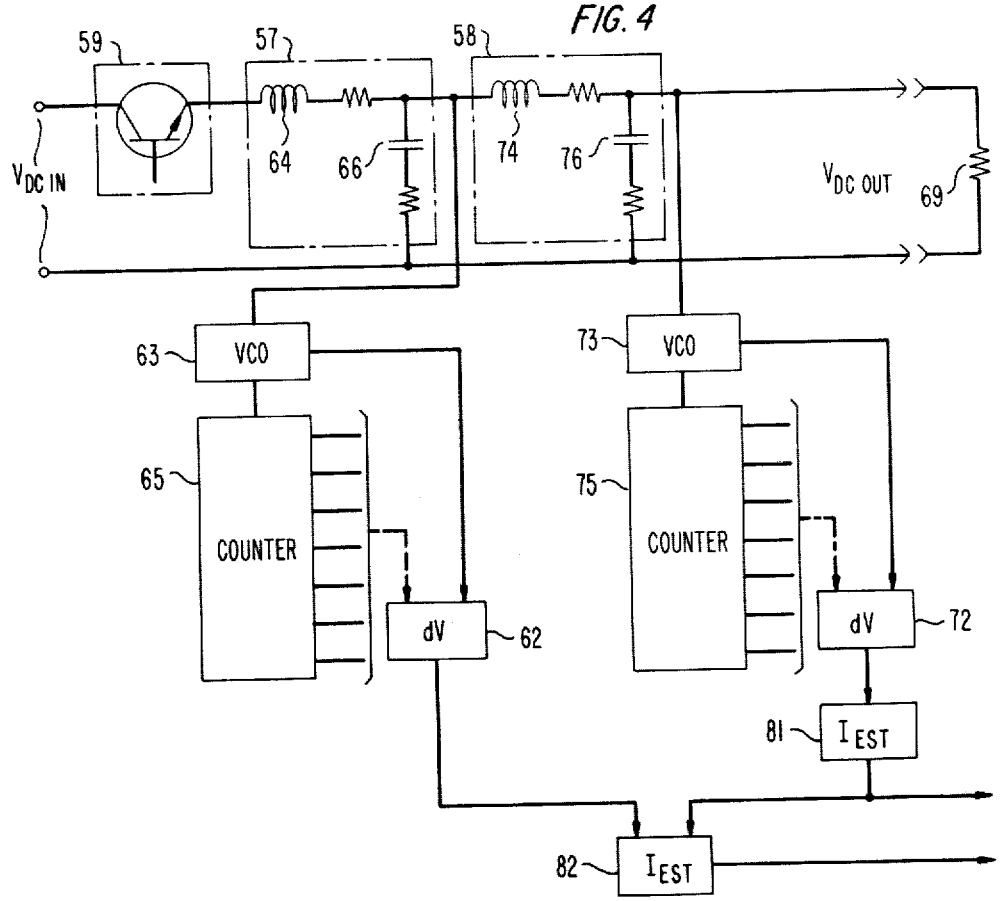
FIG. 4 is a block diagram of digital circuitry useful in estimating multiple currents in different portions of a switching regulator.

It is frequently desirable to monitor current in more than one portion of a power supply circuit. A specific example is a converter having two cascaded inductive capacitive filters. It may be desirable to determine the inductor current in each of the cascaded filters. Such a cascaded filter arrangement is shown in FIG. 4 wherein the output of the converter switching device 59 is applied to a first low-pass filter 57 including an inductor 64 and capacitor 66 and, from thence, to a second low-pass filter 58 including the inductor 74 and the capacitor 76 which, in turn, is coupled to supply current to the output load 69. In this instance, the capacitor voltage of each of the low-pass filters 57 and 58 is independently monitored by voltage controlled oscillators 63 and 73, respectively. In each instance the capacitor voltage can be related to other circuit parameters by means of appropriate state-space equations. Suitable equations for this determination are given by equations (16), (17) and (18):

$$\frac{d\hat{V}_{c2}}{dt} = K_1 \hat{V}_{c2} + K_2 \hat{I}_2; \qquad (16)$$

$$\frac{d\hat{V}_{c1}}{dt} = K_3 \hat{I}_1 + K_4 \hat{I}_2; \text{and} \qquad (17)$$

$$\hat{I}_1 = f\left( \frac{d\hat{V}_{c1}}{dt}, \frac{d\hat{V}_{c2}}{dt}, \hat{V}_{c2} \right) \qquad (18)$$

where:
  $I_1$ is the current in inductor 64;
  $I_2$ is the current in inductor 74;
  $V_{c1}$ is the voltage of capacitor 66; and
  $V_{c2}$ is the voltage of capacitor 76.

Equation (16) relates the average output capacitor voltage of capacitor 76 and the average output inductor current of inductor 74 with a derivative of the average output voltage of capacitor 76. From this, the average output current in inductor 74 may be readily estimated as was described above with reference to the estimating circuitry in FIG. 2. As described thereinabove, the voltage controlled oscillator 73 applies a frequency output to a counter 75. Subsequent logic circuitry, shown by the block 72, determines the differential of the average value of the output voltage determined by the count of counter 75. This derivative value, determined by the logic circuitry of block 72, is applied to arithmetical logic circuitry, as shown in block 81, to determine the estimated output current flowing through the inductor 74. This circuitry is similar to the circuitry utilized hereinabove with respect to FIG. 2 and hence is not described in detail.

The output voltage across the capacitor 66 drives the voltage controlled oscillator 63 whose output is counted by counter 65 and is applied to logic circuitry shown by block 62 to determine the differential of the average of the voltage across the capacitor 66. As shown by equation (17), the current in inductor 74 and the current in inductor 64 are related to the differential of the voltage of capacitor 66. The differential of the average voltage of capacitor 66 has been determined by the logic circuitry of block 62 and the current of the inductor 74 ($I_2$) has already been estimated by the logic circuitry of block 81. These values are combined in the logic circuitry of block 82 devised according to the values of the constants $K_1$, $K_2$, $K_3$ and $K_4$ which are determined by the same method as applied hereinabove with reference to FIG. 2. The logic circuitry of block 82 derives an estimated value of the current flowing through the inductor 64.

It is readily apparent to those skilled in the art that the same estimating techniques described hereinabove with reference to FIG. 2 may be extended to estimate the value of currents flowing in other components of the power supply as well as the output load current of the power supply.

Figure 5:
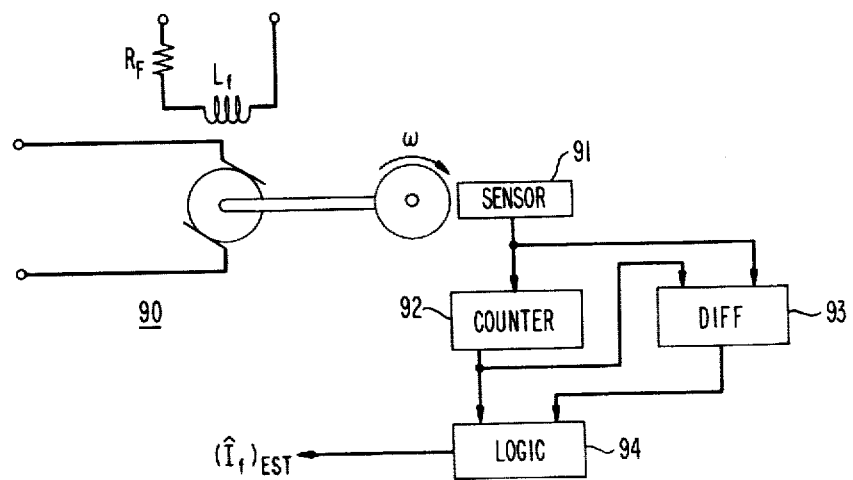
FIG. 5 discloses a digital arrangement for estimating a field current in a DC motor.

The above estimating techniques are equally applicable in other areas of electrical technology where the estimating of signals which are not readily accessible is desirable. An example is a DC motor, such as shown in FIG. 5, wherein it is desirable to determine the field current of a DC motor 90 by estimating techniques since the current may not be accessible to direct measurement. Again, the relations of various signals and component parameters of the motor are related by a state-space equation such as shown in equation (19):

$$\frac{d\hat{W}_1}{dt} + K_1\hat{W}_1 + K_2\hat{I}_f \quad (19)$$

where:
$W_1$ = angular velocity of motor armature; and
$I_f$ = average field current of motor.

The current estimating logic circuitry first determines the average angular velocity of the armature. As shown in FIG. 5, a sensor 91 digitally detects the rotation of the armature and generates a pulse in response to each sensed revolution. These pulses are applied to a counter 92. This count is utilized to determine a differential of the average value of the angular velocity in logic block 93 in the same manner as a differential of a value is obtained above. The count representing the average value of the angular velocity and the differential of the average value is combined by logic circuitry in block 94 using techniques similar to those described above to derive an estimated value of the field current of the motor.

Many other varied schemes will be readily apparent to those skilled in the art for the purpose of estimating signal values in various electrical circuits and devices in accord with the above-described signal estimating techniques without departing from the spirit and scope of this invention.

We claim:

1. A signal monitoring system for estimating an average current of a circuit by monitoring a voltage output of the circuit comprising:

first means including a counting means for deriving a first numerical value functionally related to an average of the voltage output;

second means including a down counter for deriving a second numerical value functionally related to a differential of an average of the voltage output; and arithmetical means responsive to said first and second means to weigh and combine said first and second numerical values in accord with a relation $$\hat{A}V + B\frac{d\hat{V}}{dt} = \hat{I}$$

to obtain an estimated output current value, wherein A and B are constants determined by physical parameters of the circuit;

said arithmetical means including subtract means responsive to the counting means for determining a numerical value proportional to a deviation of the average output voltage from a desired output voltage value, summing means for weighting numerical values derived by the down counter and said subtract means, and shifting means responsive to said summing means to adjust count values of the summing means to obtain a numerical value proportional to an average output current of a circuit.

2. A signal monitoring system as defined in claim 1 wherein said first means comprises a voltage-to-frequency converter and counting means for counting cycles of a signal frequency generated by said voltage-to-frequency converter, whereby a numerical value proportional to an averge of the voltage output is obtained.

3. A signal monitoring system as defined in claim 1 wherein said second means comprises a down counter responsive to be decremented by said voltage-to-frequency converter and first register means to preset said down counter with a numerical value generated by said voltage-to-frequency converter in a previous cycle of operation of the signal monitoring system.

4. A signal monitoring system for estimating an average current of a circuit by monitoring a voltage output of the circuit comprising:

first means for deriving a first numerical value functionally related to an average of the voltage output, said first means comprising a voltage-to-frequency converter and counting means for counting cycles of a signal frequency generated by said voltage-to-frequency converter, whereby a numerical value proportional to an average of the voltage output is obtained, second means for deriving a second numerical value functionally related to a differential of an average of the voltage output;

said second means comprising a down counter responsive to be decremented by said voltage-to-frequency converter and first register means to preset said down counter with a numerical value generated by said voltage-to-frequency converter in a previous cycle of operation of the signal monitoring system, arithmetical means responsive to said first and second means to weigh and combine said first and second numerical value in accord with a relation $$A\hat{V} + B\frac{d\hat{V}}{dt} = \hat{I}$$

to obtain an estimated output current value, wherein A and B are constants determined by physical parameters of the circuit, said arithmetical means including subtract means responsive to the counting means for determining a numerical value proportional to a deviation of the average output voltage from a desired output voltage value, summing means for weighting numerical values derived by the down counter and said subtract means, and shifting means responsive to said summing means to adjust count values of the summing means to obtain a numerical value proportional to an average output current of a circuit.

5. A method of estimating a current signal by monitoring a voltage signal comprising the steps of:
converting the voltage magnitude to a signal frequency;
periodically counting the signal frequency to generate a present count value proportional to an average of the voltage signal, subtracting the present count value from a preset count value obtained from a previous cycle of operation to derive an error count; and
decrementing a count value from a previous cycle of operation by utilizing the signal frequency as a count down signal to obtain a differential count value proportional to a differential value of the average of the voltage signal, and weighting and summing the differential count and error count with constants derived from parameters of a circuit being monitored to generate a count proportional to an estimated value of the current signal.

6. A method of estimating a current signal as defined in claim 5 wherein a weighting and summing of counts is performed by shifting digit positions of numerical count values and summing predetermined constants with the numerical count values.

7. An average current signal estimating arrangement for application to a circuit where a current signal is related to a voltage signal and a differential of the voltage signal comprising:
averaging means for generating a first signal value proportional to an average value of the voltage signal;
differential means for generating a second signal value proportional to a differential of an average value of the voltage signal; and
weighting means for adjusting a magnitude of the first and second signal values generated by said averaging means and said differential means by multiplying and summing the first and second signal values with constants predetermined by component values of the circuit in order to generate an output signal value proportional to an average value of said current signal.

* * * * *